United States Patent
Green et al.

(10) Patent No.: US 10,396,122 B2
(45) Date of Patent: Aug. 27, 2019

(54) HALL SENSOR WITH BURIED HALL PLATE

(71) Applicant: Texas Instruments Incorporated, Dallas, TX (US)

(72) Inventors: Keith Ryan Green, Prosper, TX (US); Rajni J. Aggarwal, Garland, TX (US); Ajit Sharma, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/639,327

(22) Filed: Jun. 30, 2017

(65) Prior Publication Data

US 2017/0301726 A1    Oct. 19, 2017

Related U.S. Application Data

(63) Continuation of application No. 14/932,949, filed on Nov. 4, 2015, now Pat. No. 9,728,581.

(51) Int. Cl.
| | |
|---|---|
| *H01L 27/22* | (2006.01) |
| *H01L 43/04* | (2006.01) |
| *H01L 43/06* | (2006.01) |
| *H01L 43/14* | (2006.01) |

(52) U.S. Cl.
CPC .............. *H01L 27/22* (2013.01); *H01L 43/04* (2013.01); *H01L 43/065* (2013.01); *H01L 43/14* (2013.01)

(58) Field of Classification Search
None
See application file for complete search history.

(56) References Cited

U.S. PATENT DOCUMENTS

| 5,572,058 A | 11/1996 | Biard | |
|---|---|---|---|
| 8,222,679 B2* | 7/2012 | Uhlig | G01R 33/07 |
| | | | 257/252 |
| 2009/0295375 A1* | 12/2009 | Oohira | G01D 5/145 |
| | | | 324/207.21 |
| 2011/0049621 A1 | 3/2011 | Lotfi et al. | |

* cited by examiner

*Primary Examiner* — Michelle Mandala
(74) *Attorney, Agent, or Firm* — Rose Alyssa Keagy; Charles A. Brill; Frank D. Cimino

(57) ABSTRACT

A CMOS integrated circuit includes a Hall sensor having a Hall plate formed in a first isolation layer which is formed concurrently with a second isolation layer under a MOS transistor. A first shallow well with a conductivity type opposite from the first isolation layer is formed over, and extending to, the Hall plate. The first shallow well is formed concurrently with a second shallow well under the MOS transistor. The Hall sensor may be a horizontal Hall sensor for sensing magnetic fields oriented perpendicular to the top surface of the substrate of the integrated circuit, or may be a vertical Hall sensor for sensing magnetic fields oriented parallel to the top surface of the substrate of the integrated circuit.

10 Claims, 14 Drawing Sheets

HALL SENSOR WITH BURIED HALL PLATE

CROSS REFERENCE TO RELATED APPLICATIONS

Under 35 U.S.C. § 120, this continuation application claims benefits of and priority to U.S. patent application Ser. No. 14/932,949, filed on Nov. 4, 2015, the entirety of which are hereby incorporated herein by reference.

FIELD OF THE DISCLOSURE

This disclosure relates to the field of integrated circuits. More particularly, this disclosure relates to Hall-effect magnetic sensor (Hall sensors) in integrated circuits.

BACKGROUND OF THE DISCLOSURE

It is desirable to integrate a Hall sensor into an integrated circuit to reduce system cost and complexity. As complementary metal oxide semiconductor (CMOS) integrated circuits are increasingly used in analog circuit systems, due to the low fabrication cost of the CMOS devices compared to analog integrated circuits, it becomes desirable to integrate Hall sensors into CMOS integrated circuits. A conventional shallow well-based Hall sensor in a scaled CMOS technology has poor magnetic sensitivity due to low resistivity of the well.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A CMOS integrated circuit includes a Hall sensor having a Hall plate formed in an isolation layer which is formed concurrently with an isolation layer under a metal oxide semiconductor (MOS) transistor. A shallow well with a conductivity type opposite from the isolation layer is formed over, and extending to, the Hall plate. The shallow well is formed concurrently with a shallow well under the MOS transistor.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Figure 1:
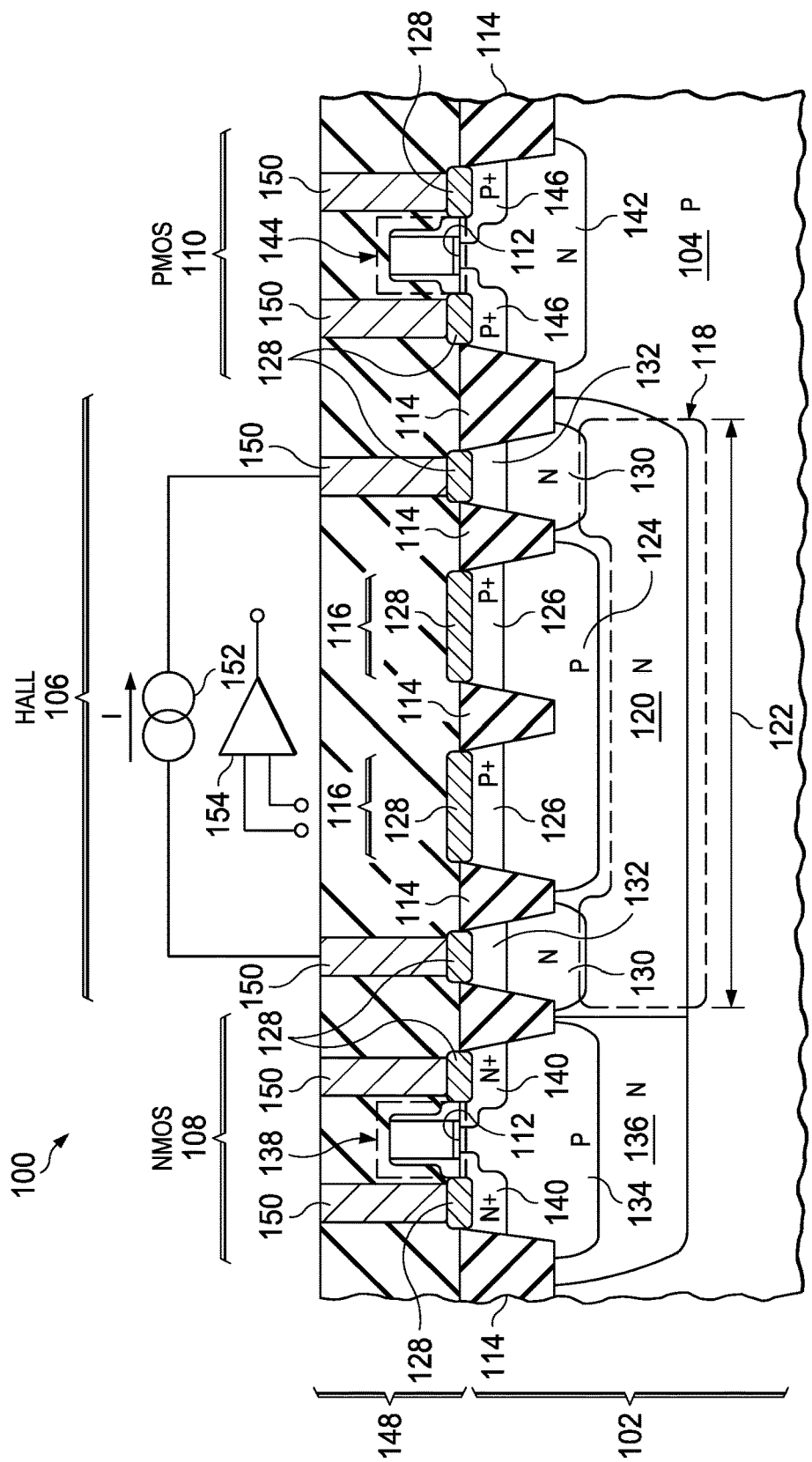
FIG. 1 is a cross section of an example integrated circuit containing a Hall sensor.

FIG. 1 is a cross section of an example integrated circuit containing a Hall sensor. The integrated circuit 100 has a substrate 102 which may be, for example, from a silicon wafer. The substrate 102 includes a p-type semiconductor material 104 which may be a top portion of a silicon wafer, or may be an epitaxial layer formed on a silicon wafer. The integrated circuit 100 includes a Hall sensor 106, an n-channel metal oxide semiconductor (NMOS) transistor 108 and a p-channel metal oxide semiconductor (PMOS) transistor 110. In the instant example, the Hall sensor 106 is a horizontal Hall sensor for sensing magnetic fields oriented perpendicular to a top surface 112 of the substrate 102. A vertical Hall sensor for sensing magnetic fields oriented parallel to the top surface 112 is within the scope of the instant example. The integrated circuit 100 may include field oxide 114 disposed at the top surface 112 of the substrate 102 to laterally isolate components and elements. The field oxide 114 may have a shallow trench isolation (STI) structure as depicted in FIG. 1. Alternatively, the field oxide 114 may have a localized oxidation of silicon (LOCOS) structure. Field oxide with another structure is within the scope of the instant example.

The Hall sensor 106 includes a Hall plate 118 disposed in a first n-type isolation layer 120 in the substrate 102. An average net dopant density of the Hall plate 118, that is an average of a difference between n-type dopants and p-type dopants in the Hall plate 118, may be, for example, $5 \times 10^{16}$ $cm^{-3}$ to $1 \times 10^{17}$ $cm^{-3}$. A thickness of the Hall plate 118 may be 0.5 microns to 1 micron. The average net dopant density and the thickness may provide a sheet resistance of 850 ohms per square to 2500 ohms per square of the Hall plate 118. A lateral length 122 of the Hall plate 118 may be, for example, 25 microns to 125 microns. Increasing the lateral length 122 may provide a higher Hall voltage from the Hall plate 118 which advantageously improves a sensitivity of the Hall sensor 106. Decreasing the lateral length 122 reduces a size of the integrated circuit which advantageously reduces fabrication cost. Forming the Hall plate 118 with the lateral length 122 of 25 microns to 125 microns may provide a desired balance between sensitivity and cost. The Hall sensor 106 includes a first shallow p-type well 124 disposed in the substrate 102 over, and extending to, the Hall plate 118. The first shallow p-type well 124 may extend below the field oxide 114. Various structures may be disposed in and/or over the first shallow p-type well 124 over the Hall plate 118. In the instant example, dummy active areas 116 with p-type regions 126, separated by elements of the field oxide 114, may be formed in the first shallow p-type well 124 over the Hall plate 118 to reduce non-planarity of the top surface 112 by an oxide chemical mechanical polish (CMP) process during formation of the field oxide 114. Electrical connections to the Hall plate 118 may be provided by first shallow n-type wells 130 disposed in the substrate 102. FIG. 1 depicts two example connections to the Hall plate 118; additional connections may be out of the plane of FIG. 1. The first shallow n-type wells 130 may be laterally separated from the first shallow p-type well 124 by elements of the field oxide 114. N-type contact regions 132 may be disposed in the substrate 102 over the first shallow n-type wells 130 to reduce electrical resistance to the Hall plate 118. Elements of the metal silicide 128 may be disposed over the n-type contact regions 132 to further reduce electrical resistance to the Hall plate 118.

The NMOS transistor 108 is disposed over a second shallow p-type well 134 disposed in the substrate 102. The first shallow p-type well 124 of the Hall sensor 106 and the second shallow p-type well 134 have substantially equal distributions of p-type dopants such as boron as a result of being formed concurrently. The second shallow p-type well 134 is contained in a second n-type isolation layer 136. The second n-type isolation layer 136 may possibly be abutting and contiguous with the first n-type isolation layer 120 which provides the Hall plate 118 as depicted in FIG. 1. Alternatively, the second n-type isolation layer 136 may be separate from the first n-type isolation layer 120. In either case, the second n-type isolation layer 136 and the first n-type isolation layer 120 have substantially equal distributions of n-type dopants such as phosphorus as a result of being formed concurrently. The NMOS transistor 108 includes an NMOS gate structure 138 disposed over the second shallow p-type well 134. The NMOS gate structure 138 includes a gate dielectric layer disposed on the top surface 112 of the substrate 102, a gate disposed on the gate dielectric layer, and possibly gate sidewall spacers disposed on lateral surfaces of the gate. The NMOS transistor 108 includes n-channel source/drain (NSD) regions 140 disposed in the substrate 102 adjacent to, and partially underlapping, the NMOS gate structure 138. The n-type contact regions 132 of the Hall sensor 106 and the NSD regions 140 may have substantially equal distributions of n-type dopants such as phosphorus and arsenic as a result of being formed concurrently. Elements of the metal silicide 128 may be disposed on the NSD regions 140 to reduce electrical resistance to the NMOS transistor 108.

The PMOS transistor 110 is disposed over a second shallow n-type well 142 disposed in the substrate 102. The first shallow n-type wells 130 of the Hall sensor 106 and the second shallow n-type well 142 may have substantially equal distributions of n-type dopants such as phosphorus as a result of being formed concurrently. The PMOS transistor 110 includes a PMOS gate structure 144 disposed over the second shallow n-type well 142. The PMOS gate structure 144 includes a gate dielectric layer disposed on the top surface 112 of the substrate 102, a gate disposed on the gate dielectric layer, and possibly gate sidewall spacers disposed on lateral surfaces of the gate. The PMOS transistor 110 includes p-channel source/drain (PSD) regions 146 disposed in the substrate 102 adjacent to, and partially underlapping, the PMOS gate structure 144. The p-type regions 126 of the Hall sensor 106 and the PSD regions 146 may have substantially equal distributions of p-type dopants such as boron as a result of being formed concurrently. Elements of the metal silicide 128 may be disposed on the PSD regions 146 to reduce electrical resistance to the PMOS transistor 110.

A pre-metal dielectric (PMD) layer 148 is disposed over the top surface 112 of the substrate 102. The PMD layer 148 may include one or more sub-layers of dielectric material, for example a PMD liner of silicon nitride on the top surface 112, a layer of silicon dioxide-based material formed by a high density plasma or a chemical vapor deposition (CVD) process using tetraethyl orthosilicate (TEOS) and ozone, a layer of silicon dioxide-based material such as phosphorus silicate glass (PSG) or boron phosphorus silicate glass (BPSG), and a cap layer of silicon nitride, silicon oxynitride, silicon carbide or silicon carbide nitride. Contacts 150 are formed through the PMD layer 148 to make contact to the metal silicide 128. The contacts 150 may have metal liners of titanium and titanium nitride, and fill metals of tungsten. Layers of metal interconnects and dielectric material, not shown in FIG. 1, are disposed above the PMD layer 148 to provide electrical connections between the components of the integrated circuit 100.

Increasing the average net dopant density of the second n-type isolation layer 136 provides better electrical isolation of the NMOS transistor 108 from the p-type semiconductor material 104, while decreasing the average net dopant density of the first n-type isolation layer 120 provides higher sensitivity of the Hall sensor 106. Forming the first n-type isolation layer 120 and the second n-type isolation layer 136 to have an average net dopant density of $5 \times 10^{16}$ cm$^{-3}$ to $1 \times 10^{17}$ cm$^{-3}$ and a thickness of 0.5 microns to 1 micron advantageously provides a desired level of isolation for the NMOS transistor 108 and a desired sensitivity of the Hall sensor 106. The first shallow p-type well 124 being disposed over, and in contact with, the Hall plate 118 enables an advantageous mode of operation. During operation of the integrated circuit 100, a bias voltage may be applied to the first shallow p-type well 124 to reverse bias a pn junction between the first shallow p-type well 124 and the Hall plate 118, which may advantageously increase the sensitivity of the Hall sensor 106. For example, the first shallow p-type well 124 may be electrically coupled to the p-type semiconductor material 104 of the substrate 102, and a positive voltage applied to the Hall plate 118. Alternatively, the first shallow p-type well 124 may be floated, providing a simplified structure for the Hall sensor 106.

The integrated circuit 100 includes at least one of a current source 152 electrically coupled to the Hall sensor 106 and a voltage sensor 154 electrically coupled to the Hall sensor 106. The current source 152 is electrically coupled to the Hall sensor 106 through the contacts 150, as depicted in FIG. 1. The voltage sensor 154 is electrically coupled to the Hall sensor 106 through other contacts 150, out of the plane of FIG. 1 in the instant example. During operation of the integrated circuit 100, the current source 152 provides a current through the Hall plate 118, and the voltage sensor 154 senses a Hall voltage on the Hall plate 118 which is a function of a magnetic field through the Hall plate 118 and provides an electrical output which is a function of the Hall voltage. Including least one of the current source 152 and the voltage sensor 154 in the integrated circuit 100 may advantageously reduce a cost and complexity of a system including the integrated circuit 100.

Figure 2A:
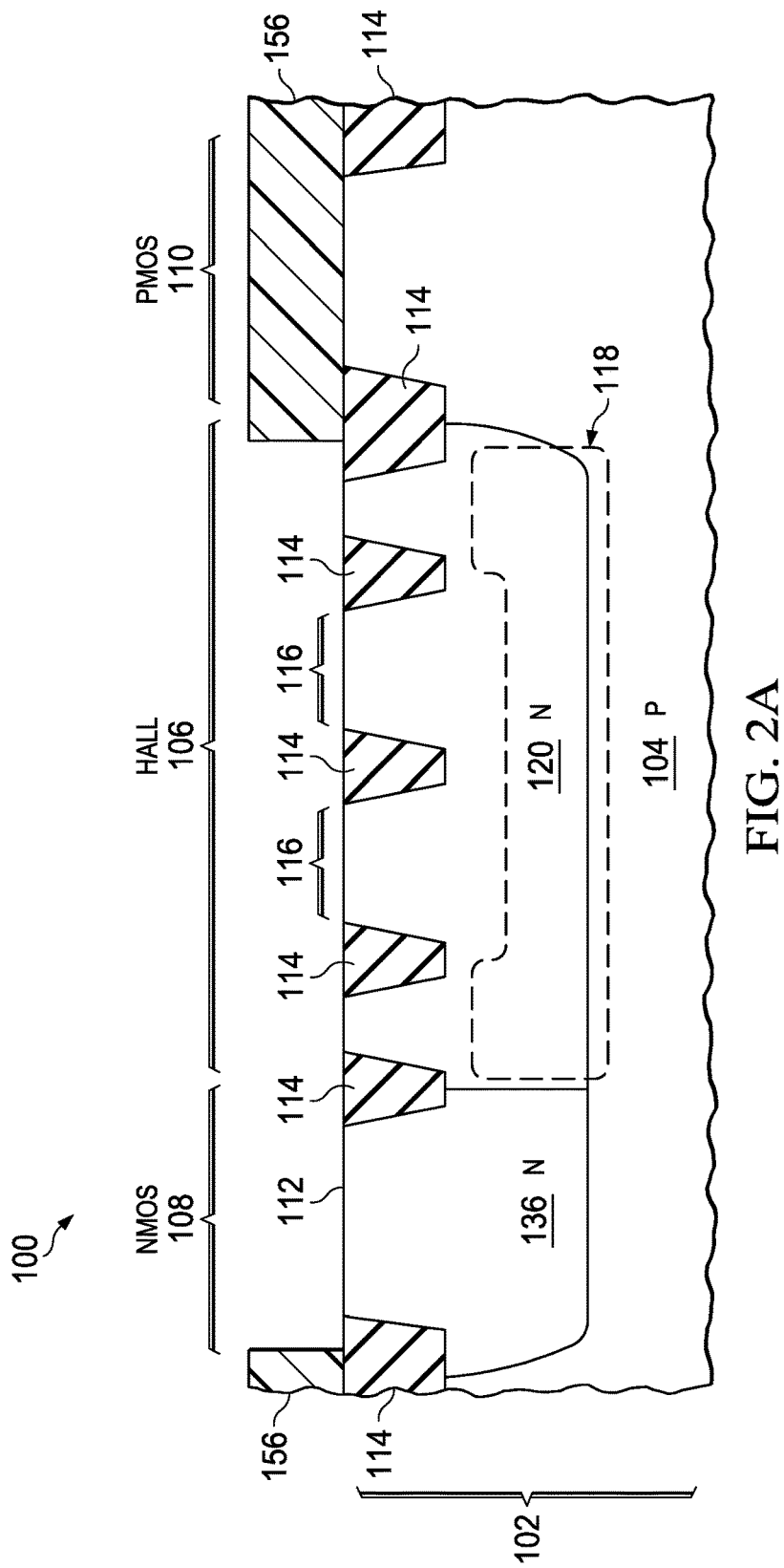
FIG. 2A through FIG. 2E are cross sections of the integrated circuit of FIG. 1, depicted in successive steps of an example formation process.

FIG. 2A through FIG. 2E are cross sections of the integrated circuit of FIG. 1, depicted in successive steps of an example formation process. Referring to FIG. 2A, the field oxide 114, including elements of the field oxide 114 defining the dummy active areas 116, is formed at the top surface 112 of the substrate 102. In one version of the instant example, the field oxide 114 may be formed by an STI process, which includes etching isolation trenches in the substrate 102, filling the trenches with dielectric material and removing excess dielectric material using an oxide CMP process. In another version of the instant example, the field oxide 114 may be formed by a LOCOS process, which includes patterning a layer of silicon nitride over the top surface 112 of the substrate 102 to expose areas for the field oxide 114, forming the field oxide 114 by a thermal oxidation process, and subsequently removing the layer of silicon nitride.

An isolation mask 156 is formed over the substrate 102 so as to expose an area for the first n-type isolation layer 120 and an area for the second n-type isolation layer 136. The isolation mask 156 may include photoresist formed by a photolithographic process, and may optionally include an anti-reflection layer such as a bottom anti-reflection coat (BARC). In the instant example, the area for the Hall sensor 106 and the area for the NMOS transistor 108 are adjacent, so the isolation mask 156 exposes a contiguous area for the first n-type isolation layer 120 providing the Hall plate 118 and the second n-type isolation layer 136 under the NMOS transistor 108. The isolation mask 156 covers the area for the PMOS transistor 110. N-type dopants such as phosphorus are implanted into the substrate 102 where exposed by the isolation mask 156; the isolation mask 156 blocks the n-type dopants from the substrate 102. The n-type dopants may be implanted, for example, at 1000 kilo-electron volts (keV) to 2000 keV with a dose of $5 \times 10^{12}$ cm$^{-2}$ to $2 \times 10^{13}$ cm$^{-2}$. The isolation mask 156 is subsequently removed, for example by an ash process followed by a wet clean process. The implanted n-type dopants are activated by an anneal process to form the first n-type isolation layer 120 and the second n-type isolation layer 136. The anneal process may include a furnace anneal process or a rapid thermal anneal process. The furnace anneal process may include a range of anneal conditions from a temperature of 850° C. for 120 minutes to a temperature of 950° C. for 10 minutes. The rapid thermal anneal process may include a range of anneal conditions from a temperature of 1000° C. for 60 seconds to a temperature of 1100° C. for 20 seconds, in a rapid thermal processor (RTP) tool. The anneal process may be performed after the n-type dopants are implanted and before any subsequent implants, or may be performed after additional n-type dopants are implanted to form the shallow n-type wells 130 and 142 of FIG. 1 and after p-type dopants are implanted to form the shallow p-type wells 124 and 134 of FIG. 1. Concurrently forming the second n-type isolation layer 136 and the first n-type isolation layer 120 may advantageously reduce fabrication cost and complexity of the integrated circuit 100 compared to forming the n-type isolation layers separately.

Figure 2B:
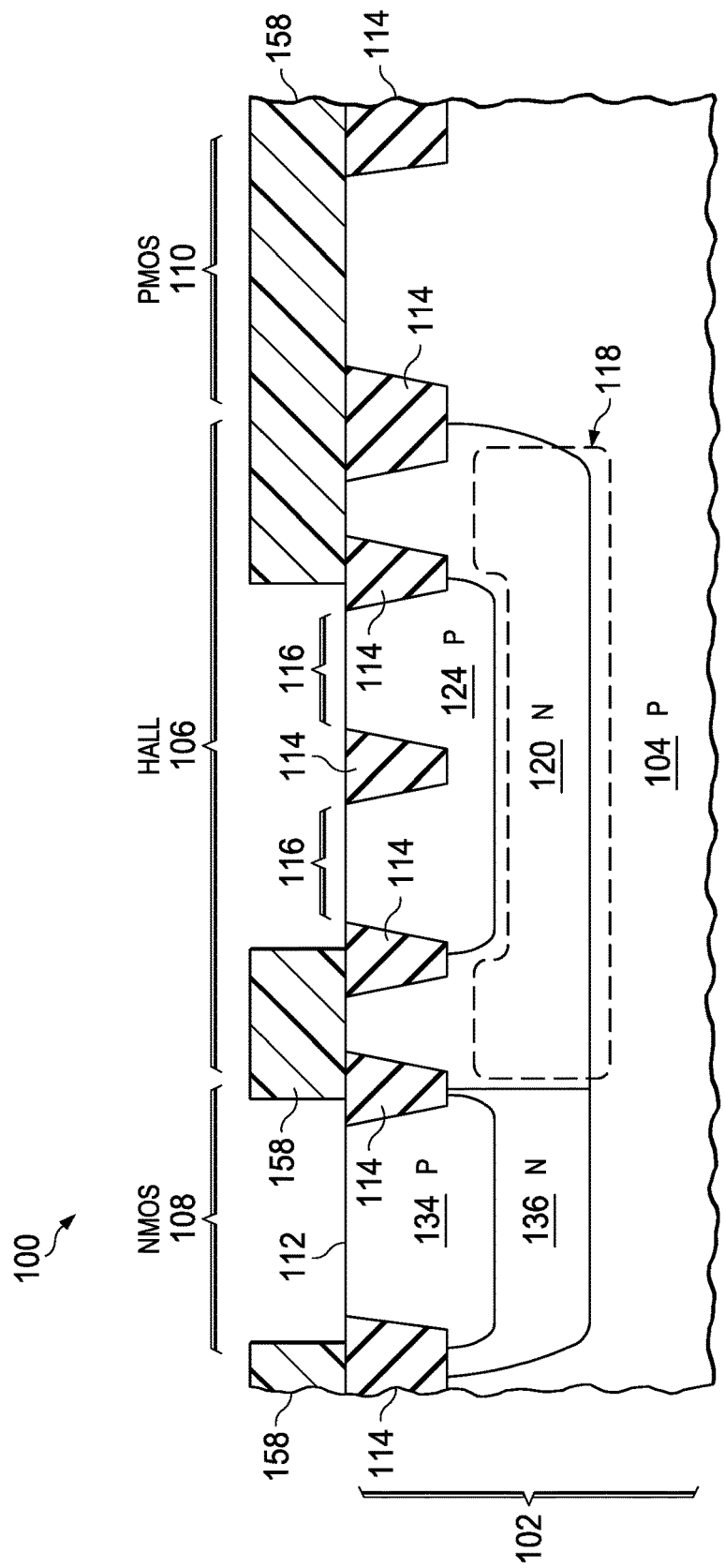

Referring to FIG. 2B, a p-type well mask 158 is formed over the substrate 102 so as to expose areas for the first shallow p-type well 124 in the Hall sensor 106 and the second shallow p-type well 134 under the NMOS transistor 108. The p-type well mask 158 covers the area for the PMOS transistor 110. The p-type well mask 158 may include photoresist formed by a photolithographic process, and may optionally include an anti-reflection layer such as a BARC. P-type dopants such as boron are implanted into the substrate 102 where exposed by the p-type well mask 158; the p-type well mask 158 blocks the p-type dopants from the substrate 102. The p-type dopants may be implanted, for example, at 200 kilo-electron volts (keV) to 500 keV with a dose of $2 \times 10^{13}$ cm$^{-2}$ to $5 \times 10^{13}$ cm$^{-2}$. Additional p-type dopants may be implanted at lower energies, for example to provide punch-through, channel stop and threshold adjust layers for the NMOS transistor 108. The p-type well mask 158 is subsequently removed, for example as described in reference to the isolation mask 156 of FIG. 2A. The implanted p-type dopants are activated by an anneal process to form the first shallow p-type well 124 and the second shallow p-type well 134. The first shallow p-type well 124 extends to the Hall plate 118. The anneal process may be, for example, a furnace anneal process or a rapid thermal anneal process, as described in reference to FIG. 2A. The anneal process may be the same anneal process used to activate the implanted n-type dopants in the first n-type isolation layer 120 and the second n-type isolation layer 136, or may be a separate anneal process. Concurrently forming the first shallow p-type well 124 of the Hall sensor 106 and the second shallow p-type well 134 under the NMOS transistor 108 may advantageously further reduce fabrication cost and complexity of the integrated circuit 100 compared to forming the shallow p-type wells separately.

Figure 2C:
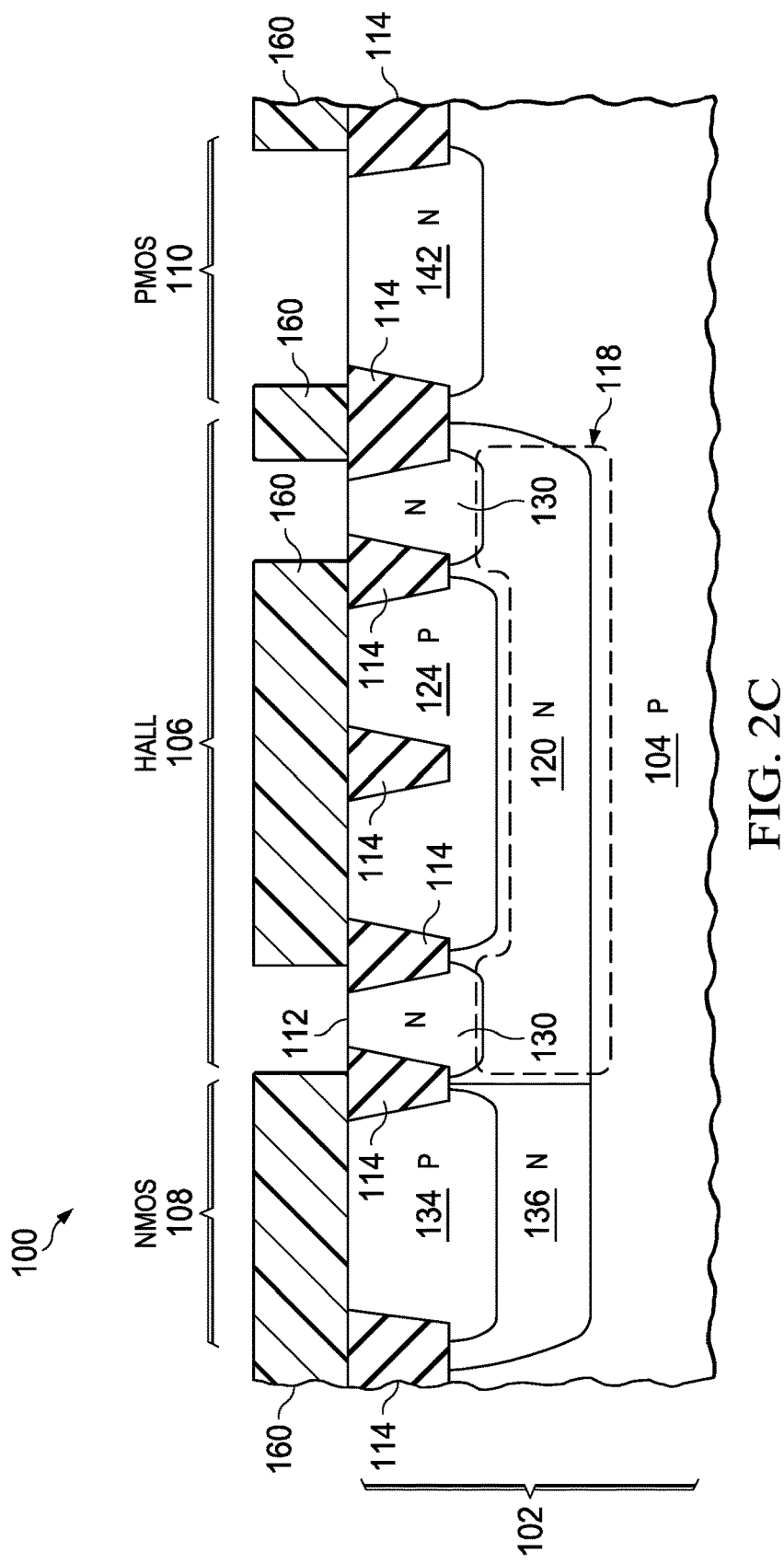

Referring to FIG. 2C, an n-type well mask 160 is formed over the substrate 102 so as to expose areas for the first shallow n-type wells 130 in the Hall sensor 106 and the second shallow n-type well 142 under the PMOS transistor 110. The n-type well mask 160 covers the area for the NMOS transistor 108. The n-type well mask 160 may be formed similarly to the p-type well mask 158 of FIG. 2B. N-type dopants such as phosphorus are implanted into the substrate 102 where exposed by the n-type well mask 160; the n-type well mask 160 blocks the n-type dopants from the substrate 102. The n-type dopants may be implanted, for example, at 400 kilo-electron volts (keV) to 750 keV with a dose of $2 \times 10^{13}$ cm$^{-2}$ to $8 \times 10^{13}$ cm$^{-2}$. Additional n-type dopants such as phosphorus and arsenic may be implanted at lower energies, for example to provide punch-through, channel stop and threshold adjust layers for the PMOS transistor 110. The n-type well mask 160 is subsequently removed, for example as described in reference to the isolation mask 156 of FIG. 2A. The implanted n-type dopants are activated by an anneal process to form the first shallow n-type wells 130 and the second shallow n-type well 142. The anneal process may be, for example, a furnace anneal process or a rapid thermal anneal process, as described in reference to FIG. 2A. The anneal process may be the same anneal process used to activate the implanted p-type dopants in the first shallow p-type well 124 and the second shallow p-type well 134, or may be a separate anneal process. Forming the first shallow n-type wells 130 of the Hall sensor 106 concurrently with the second shallow n-type well 142 under the PMOS transistor 110 may advantageously further reduce fabrication cost and complexity of the integrated circuit 100 compared to forming the shallow n-type wells separately.

Figure 2D:
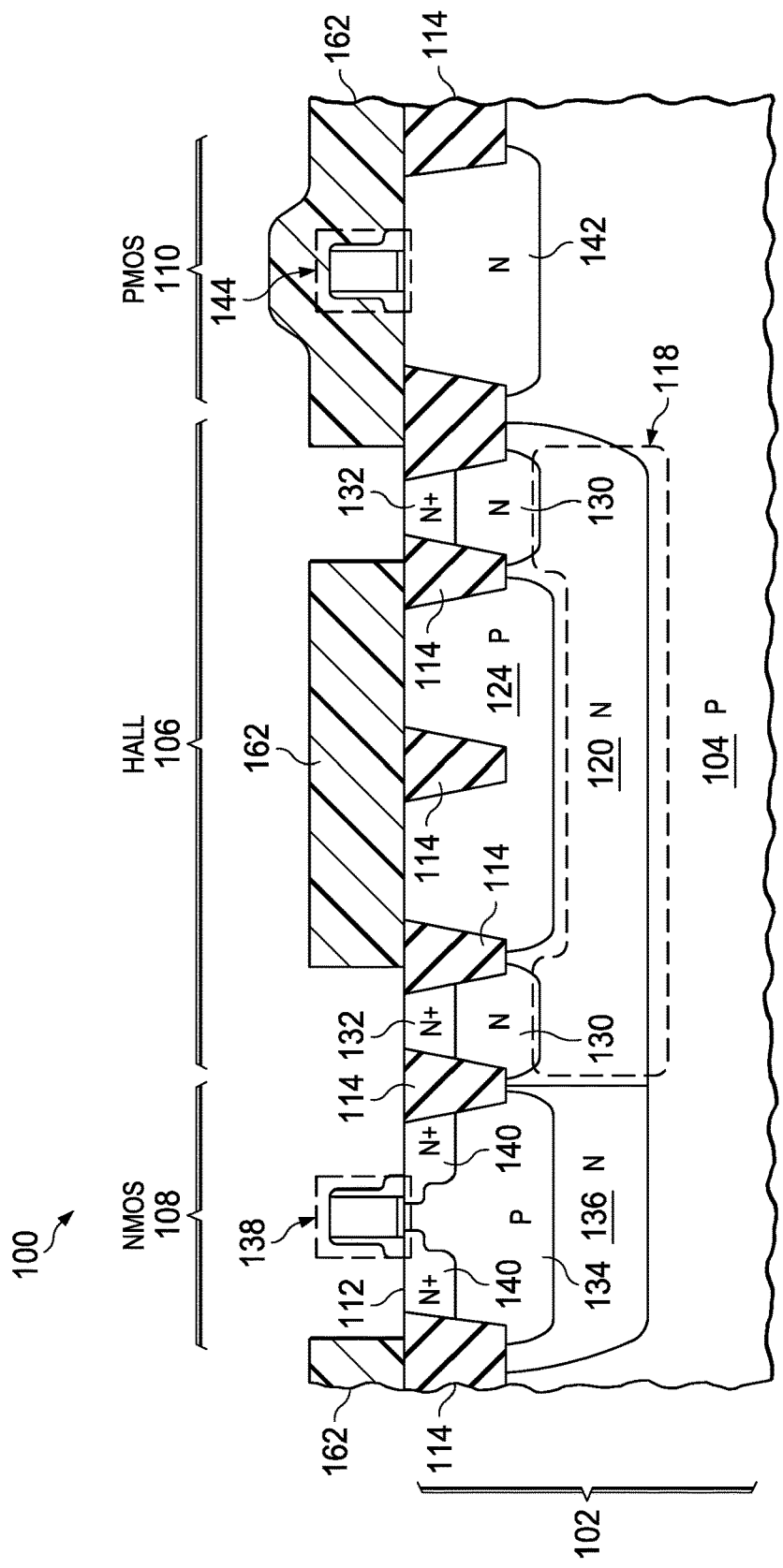

Referring to FIG. 2D, the NMOS gate structure 138 of the NMOS transistor 108 and the PMOS gate structure 144 of the PMOS transistor 110 are formed on the substrate 102. N-type drain extensions, not shown in FIG. 2C, may be formed in the substrate 102 adjacent to the NMOS gate structure 138, and p-type drain extensions, not shown in FIG. 2C, may be formed in the substrate 102 adjacent to the PMOS gate structure 144. An NSD mask 162 is formed over the substrate 102 so as to expose areas for the n-type contact regions 132 in the Hall sensor 106 and the NSD regions 140 of the NMOS transistor 108. The NSD mask 162 covers the area for the PMOS transistor 110. The NSD mask 162 may include photoresist formed by a photolithographic process, and may include an anti-reflection layer such as a BARC. N-type dopants such as phosphorus and arsenic, and possibly antimony, are implanted into the substrate 102 where exposed by the NSD mask 162; the NSD mask 162 blocks the n-type dopants from the substrate 102. The n-type dopants may be implanted in more than one implant step with implant energies ranging, for example, from 20 keV to 60 keV and with a total dose of $1 \times 10^{15}$ cm$^{-2}$ to $4 \times 10^{15}$ cm$^{-2}$. The NSD mask 162 is subsequently removed, for example as described in reference to the isolation mask 156 of FIG. 2A. The implanted n-type dopants are activated by an anneal process to form the n-type contact regions 132 and the NSD regions 140. The anneal process may be, for example, a rapid thermal anneal process as described in reference to FIG. 2A, or a flash anneal process. An example flash anneal process uses radiant energy to heat the substrate 102 at the top surface 112 to a temperature of 1200° C. to 1250° C. for 1 millisecond to 5 milliseconds. Forming the n-type contact regions 132 of the Hall sensor 106 concurrently with the NSD regions 140 of the NMOS transistor 108 may advantageously further reduce fabrication cost and complexity of the integrated circuit 100 compared to forming the n-type regions separately.

Figure 2E:
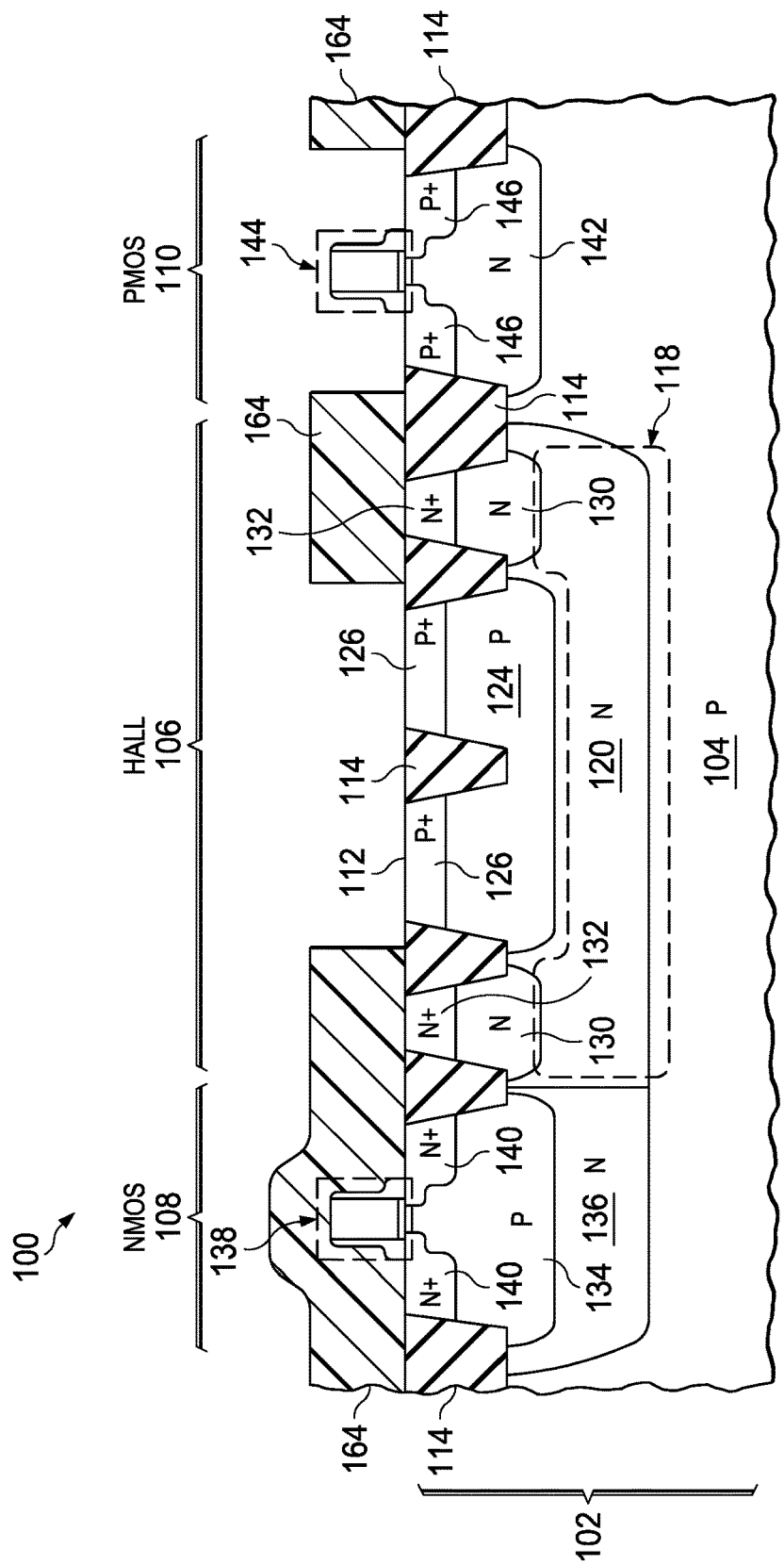

Referring to FIG. 2E, a PSD mask 164 is formed over the substrate 102 so as to expose areas for the p-type regions 126 in the Hall sensor 106 and the PSD regions 146 of the PMOS transistor 110. The PSD mask 164 covers the area for the NMOS transistor 108. The PSD mask 164 may be formed similarly to the NSD mask 162 of FIG. 2D. P-type dopants such as boron and gallium, and possibly indium, are implanted into the substrate 102 where exposed by the PSD mask 164; the PSD mask 164 blocks the p-type dopants from the substrate 102. The p-type dopants may be implanted in more than one implant step with implant energies ranging, for example, from 3 keV to 20 keV and with a total dose of $1 \times 10^{15}$ cm$^{-2}$ to $4 \times 10^{15}$ cm$^{-2}$. The PSD mask 164 is subsequently removed, for example as described in reference to the isolation mask 156 of FIG. 2A. The implanted p-type dopants are activated by an anneal process to form the p-type regions 126 and the PSD regions 146. The anneal process may be, for example, a rapid thermal anneal process or a flash anneal process, and may be performed concurrently with the anneal process for the n-type contact regions 132 and the NSD regions 140. Forming the p-type regions 126 of the Hall sensor 106 concurrently with the PSD regions 146 of the PMOS transistor 110 may advantageously further reduce fabrication cost and complexity of the integrated circuit 100 compared to forming the p-type regions separately.

Formation of the integrated circuit 100 is continued with forming the metal silicide 128 of FIG. 1 on exposed semiconductor material at the top surface 112 of the substrate 102. Subsequently, the PMD layer 148 and the contacts 150 are formed to provide the structure of FIG. 1. A Hall sensor analogous to that disclosed in reference to FIG. 1 and FIG. 2A through FIG. 2E may be formed with a p-type Hall plate, by appropriate changes in polarities of dopants and conductivity types.

Figure 3:
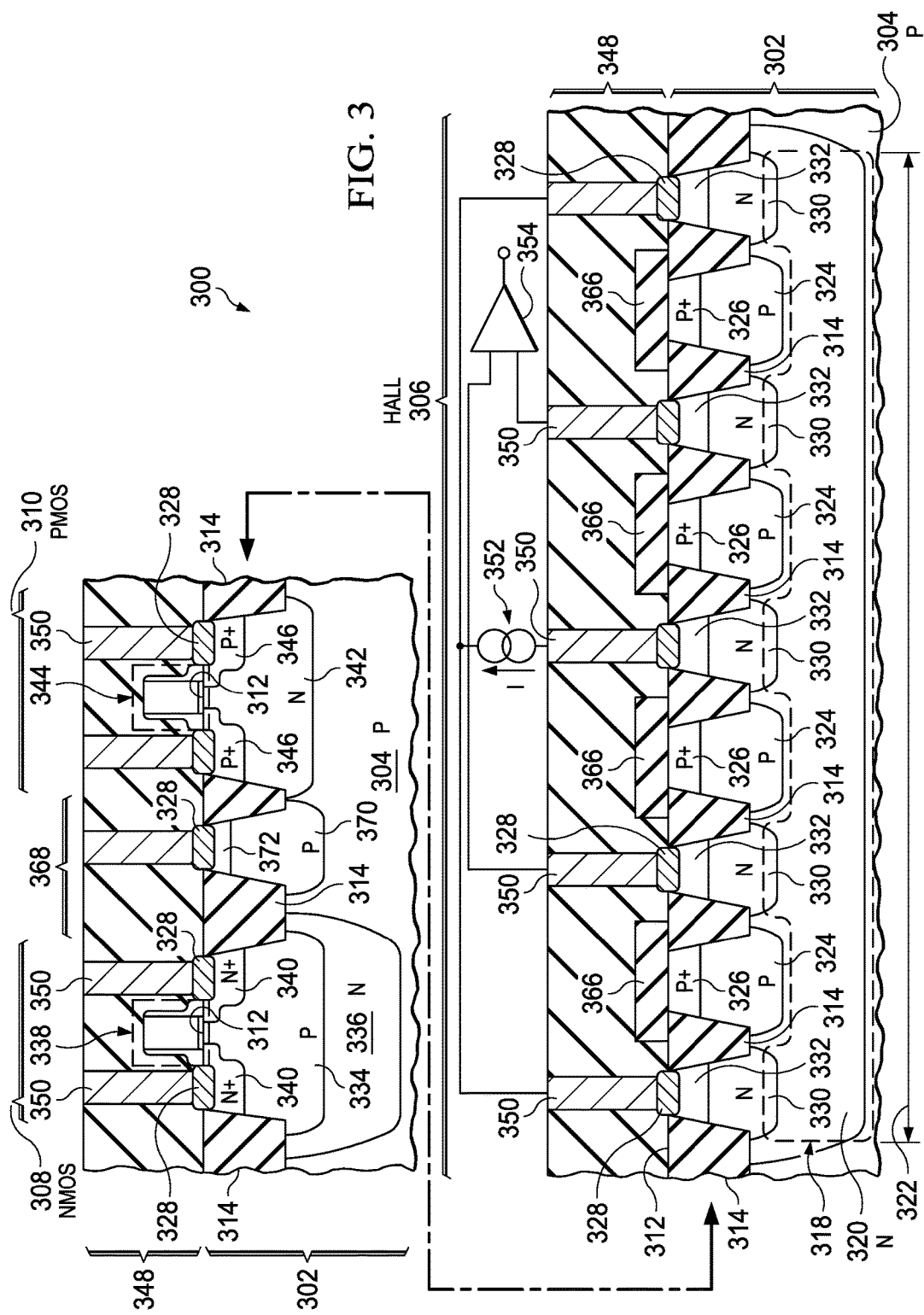
FIG. 3 is a cross section of another example integrated circuit containing a Hall sensor.

FIG. 3 is a cross section of another example integrated circuit containing a Hall sensor. The integrated circuit 300 has a substrate 302 including a p-type semiconductor material 304. The integrated circuit 300 includes a Hall sensor 306, an NMOS transistor 308 and a PMOS transistor 310. In the instant example, the Hall sensor 306 is a vertical Hall sensor for sensing magnetic fields oriented parallel to a top surface 312 of the substrate 302. A horizontal Hall sensor for sensing magnetic fields oriented perpendicular to the top surface 312 is within the scope of the instant example. The integrated circuit 300 may include field oxide 314 disposed at the top surface 312 of the substrate 302 to laterally isolate components and elements.

The Hall sensor 306 includes a Hall plate 318 disposed in a first n-type isolation layer 320 in the substrate 302. An average net dopant density of the Hall plate 318 may be, for example, $5 \times 10^{16}$ cm$^{-3}$ to $1 \times 10^{17}$ cm$^{-3}$. A thickness of the Hall plate 318 may be 0.5 microns to 1 micron. The average net dopant density and the thickness may provide a sheet resistance of 850 ohms per square to 2500 ohms per square of the Hall plate 318. A lateral length 322 of the Hall plate 318 may be, for example, 50 microns to 125 microns for a vertical Hall sensor. Forming the Hall plate 318 with the lateral length 322 of 50 microns to 125 microns may provide a desired balance between sensitivity and cost. The Hall sensor 306 includes first shallow p-type wells 324 disposed in the substrate 302 over, and extending to, the Hall plate 318. The first shallow p-type wells 324 may extend below the field oxide 314 and may possibly be contiguous at locations out of the plane of FIG. 3. The first shallow p-type wells 324 may be biased or floated, as described in reference to the first shallow p-type well 124 of FIG. 1, accruing the advantages disclosed therein. Various structures may be disposed in and/or over the first shallow p-type wells 324 over the Hall plate 318. In the instant example, p-type regions 326 may be disposed in the first shallow p-type wells 324 and a layer of silicide block dielectric 366 disposed over the p-type regions 326. Electrical connections to the Hall plate 318 may be provided by first shallow n-type wells 330 disposed in the substrate 302. FIG. 3 depicts four example connections to the Hall plate 318; the Hall sensor 306 may include additional connections. The first shallow n-type wells 330 may be laterally separated from the first shallow p-type wells 324 by elements of the field oxide 314. N-type contact regions 332 may be disposed in the substrate 302 over the first shallow n-type wells 330 to reduce electrical resistance to the Hall plate 318. Elements of the metal silicide 328 may be disposed over the n-type contact regions 332 to further reduce electrical resistance to the Hall plate 318.

The NMOS transistor 308 is disposed over a second shallow p-type well 334 disposed in the substrate 302. The first shallow p-type wells 324 of the Hall sensor 306 and the second shallow p-type well 334 have substantially equal distributions of p-type dopants such as boron as a result of being formed concurrently, for example as described in reference to FIG. 2B. The second shallow p-type well 334 is contained in a second n-type isolation layer 336, which may be separate from the first n-type isolation layer 320 which provides the Hall plate 318 as depicted in FIG. 3. Alternatively, the second shallow p-type well 334 may be contained in a common n-type isolation layer which provides the Hall plate 318, as described in reference to FIG. 1. In either case, the second n-type isolation layer 336 containing the second shallow p-type well 334 and the first n-type isolation layer 320 which provides the Hall plate 318 have substantially equal distributions of n-type dopants such as phosphorus as a result of being formed concurrently, for example as described in reference to FIG. 2A. The NMOS transistor 308 includes an NMOS gate structure 338 disposed over the second shallow p-type well 334 and NSD regions 340 disposed in the substrate 302 adjacent to, and partially underlapping, the NMOS gate structure 338, similar to that described in reference to FIG. 1. The n-type contact regions 332 of the Hall sensor 306 and the NSD regions 340 may have substantially equal distributions of n-type dopants such as phosphorus and arsenic as a result of being formed concurrently, for example as described in reference to FIG. 2D. Elements of the metal silicide 328 may be disposed on the NSD regions 340 to reduce electrical resistance to the NMOS transistor 308.

The PMOS transistor 310 is disposed over a second shallow n-type well 342 disposed in the substrate 302. The first shallow n-type wells 330 of the Hall sensor 306 and the second shallow n-type well 342 may have substantially equal distributions of n-type dopants such as phosphorus as a result of being formed concurrently, for example as described in reference to FIG. 2C. The PMOS transistor 310 includes a PMOS gate structure 344 and PSD regions 346 disposed in the substrate 302 adjacent to, and partially underlapping, the PMOS gate structure 344, similar to that described in reference to FIG. 1. The p-type regions 326 of the Hall sensor 306 and the PSD regions 346 may have substantially equal distributions of p-type dopants such as boron as a result of being formed concurrently, for example as described in reference to FIG. 2E. Elements of the metal silicide 328 may be disposed on the PSD regions 346 to reduce electrical resistance to the PMOS transistor 310.

In the instant example, the integrated circuit 300 may also include a substrate tap 368 which provides an electrical connection to the p-type semiconductor material 304. The substrate tap 368 includes a third shallow p-type well 370 disposed in the substrate 302. The first shallow p-type wells 324 of the Hall sensor 306 and the third shallow p-type well 370 have substantially equal distributions of p-type dopants such as boron as a result of being formed concurrently, for example as described in reference to FIG. 2B. The substrate tap 368 also includes a p-type contact region 372 disposed in the third shallow p-type well 370. The p-type regions 326 of the Hall sensor 306 and the p-type contact region 372 may have substantially equal distributions of p-type dopants such as boron as a result of being formed concurrently, for example as described in reference to FIG. 2E. An element of the metal silicide 328 may be disposed on the p-type contact region 372 to reduce electrical resistance to the p-type semiconductor material 304. A Hall sensor analogous to that disclosed in reference to FIG. 3 may be formed with a p-type Hall plate, by appropriate changes in polarities of dopants and conductivity types.

A PMD layer 348 and contacts 350, for example as described in reference to FIG. 1, are disposed over the top surface 312 of the substrate 302. Layers of metal interconnects and dielectric material, not shown in FIG. 3, are disposed above the PMD layer 348 to provide electrical connections between the components of the integrated circuit 300. The integrated circuit 300 accrues the advantages discussed in reference to the integrated circuit 100 of FIG. 1.

The integrated circuit 300 includes at least one of a current source 352 electrically coupled to the Hall sensor 306 and a voltage sensor 354 electrically coupled to the Hall sensor 306. The current source 352 is electrically coupled to the Hall sensor 306 through the contacts 350, as depicted in FIG. 3. The voltage sensor 354 is electrically coupled to the Hall sensor 306 through other contacts 350, as depicted in FIG. 3. During operation of the integrated circuit 300, the current source 352 provides a current through the Hall plate 318, and the voltage sensor 354 senses a Hall voltage on the Hall plate 318 which is a function of a magnetic field through the Hall plate 318 and provides an electrical output which is a function of the Hall voltage.

Figure 4:
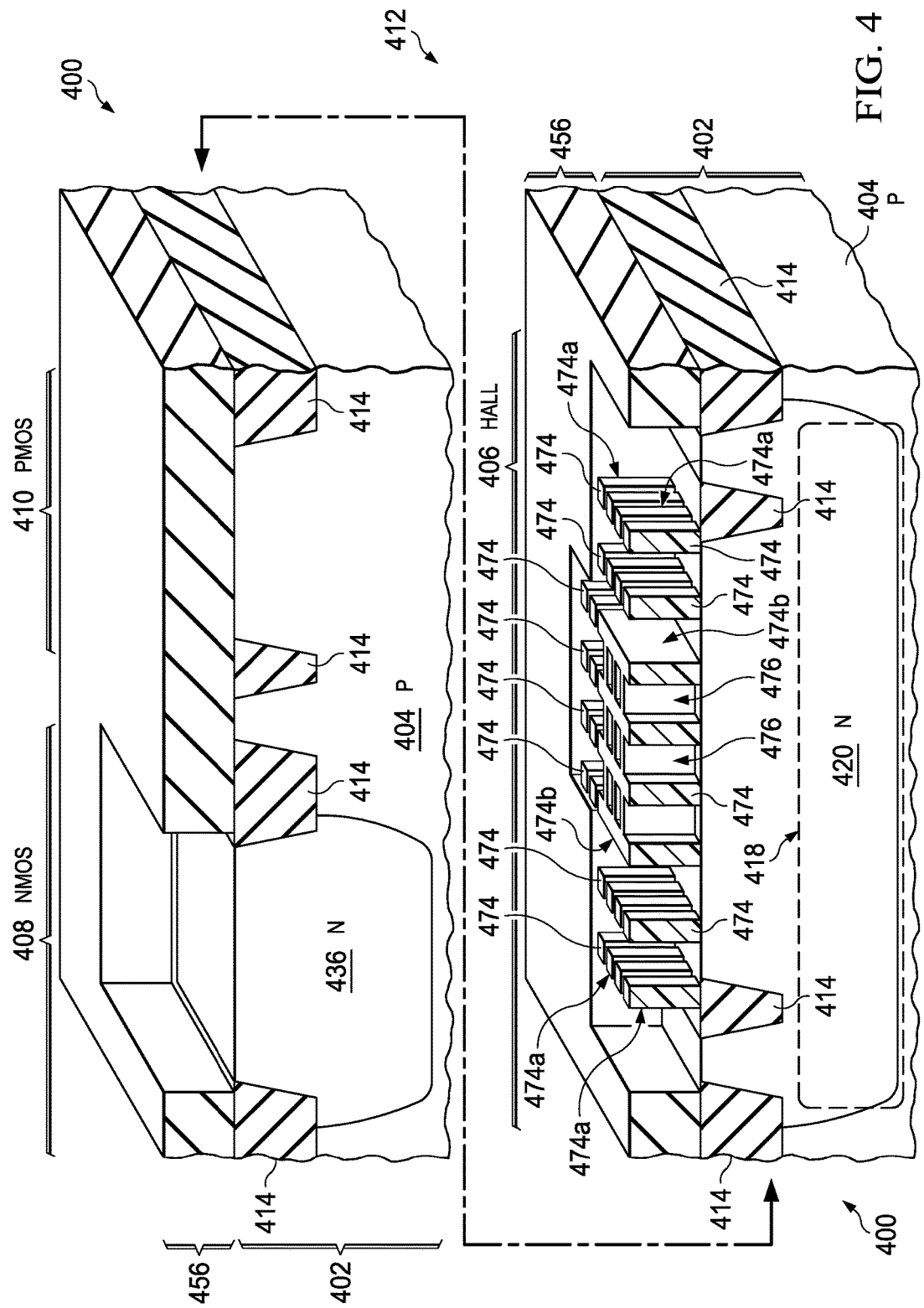
FIG. 4 is a cross section of another integrated circuit containing a Hall sensor, depicted during formation of isolation layers.

FIG. 4 is a cross section of another integrated circuit containing a Hall sensor, depicted during formation of isolation layers. The integrated circuit 400 is formed in and on a substrate 402 having a p-type semiconductor material 404. The integrated circuit includes an area for a Hall sensor 406, an NMOS transistor 408 and a PMOS transistor 410. The integrated circuit 400 may include field oxide 414 disposed at the top surface 412 of the substrate 402 to laterally isolate components and elements.

An isolation mask 456 is formed over the substrate 402 so as to expose an area for a first n-type isolation layer 420 in the area for the Hall sensor 406 and a second n-type isolation layer 436 under the area for the NMOS transistor 408. The isolation mask 456 may be formed similarly to the isolation mask 156 described in reference to FIG. 2A. In the instant example, the area for the Hall sensor 406 and the area for the NMOS transistor 408 are separate. The isolation mask 456 covers the area for the PMOS transistor 410. In the instant example, the isolation mask 456 includes one or more blocking elements 474 in the area for the Hall sensor 406 for the purpose of diluting n-type dopants during a subsequent implant process. The blocking elements 474 may include a plurality of discrete blocking elements 474a or one or more continuous blocking elements 474b with apertures 476. The blocking elements 474 may cover, for example, 20 percent to 80 percent of the area for the Hall Sensor 406. In the instant example, the area for the NMOS transistor 408 is free of the blocking elements 474.

N-type dopants such as phosphorus are implanted into the substrate 402 where exposed by the isolation mask 456; the n-type dopants are blocked from the substrate 402 by the isolation mask 456, including the blocking elements 474. The n-type dopants may be implanted at a dose and an energy as described in reference to FIG. 2A, for example. The blocking elements 474 reduce the number of the n-type dopants per unit area reaching the substrate 402 in the area for the Hall sensor 406 compared to the area for the NMOS transistor 408.

The isolation mask 456 is subsequently removed, for example by an ash process followed by a wet clean process. The implanted n-type dopants are activated by an anneal process to form the first n-type isolation layer 420 in the area for the Hall sensor 406 which provides a Hall plate 418 of the Hall sensor 406, and to form the second n-type isolation layer 436 under the area for the NMOS transistor 408. The anneal process may include a furnace anneal process or a rapid thermal anneal process. An average net dopant density of the Hall plate 418 is lower than an average net dopant density of the second n-type isolation layer 436, due to the n-type dopants blocked from the substrate 402 by the blocking elements 474. The lower average net dopant density of the Hall plate 418 may advantageously provide a higher sensitivity of the Hall sensor 406 compared to a Hall sensor with a Hall plate having a higher average net dopant density. Concurrently forming the second n-type isolation layer 436 and the first n-type isolation layer 420 may advantageously reduce fabrication cost and complexity of the integrated circuit 400 compared to forming the n-type isolation layers separately. In an alternate version of the instant example, the first n-type isolation layer 420 and the second n-type isolation layer 436 may abut each other, similar to the structure shown in FIG. 1.

Figure 5A:
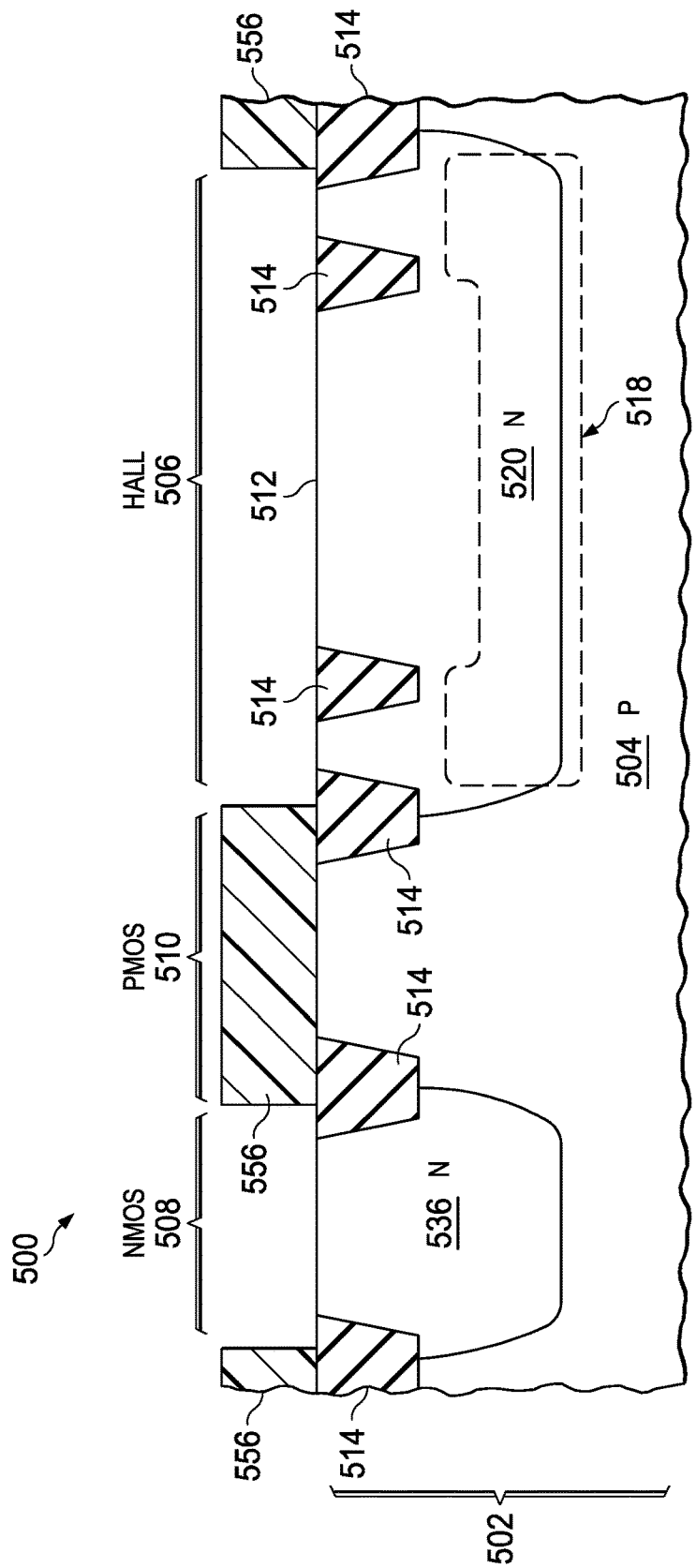
FIG. 5A through FIG. 5C are cross sections of another integrated circuit containing a Hall sensor, depicted steps of formation of isolation layers.
Figure 5B:
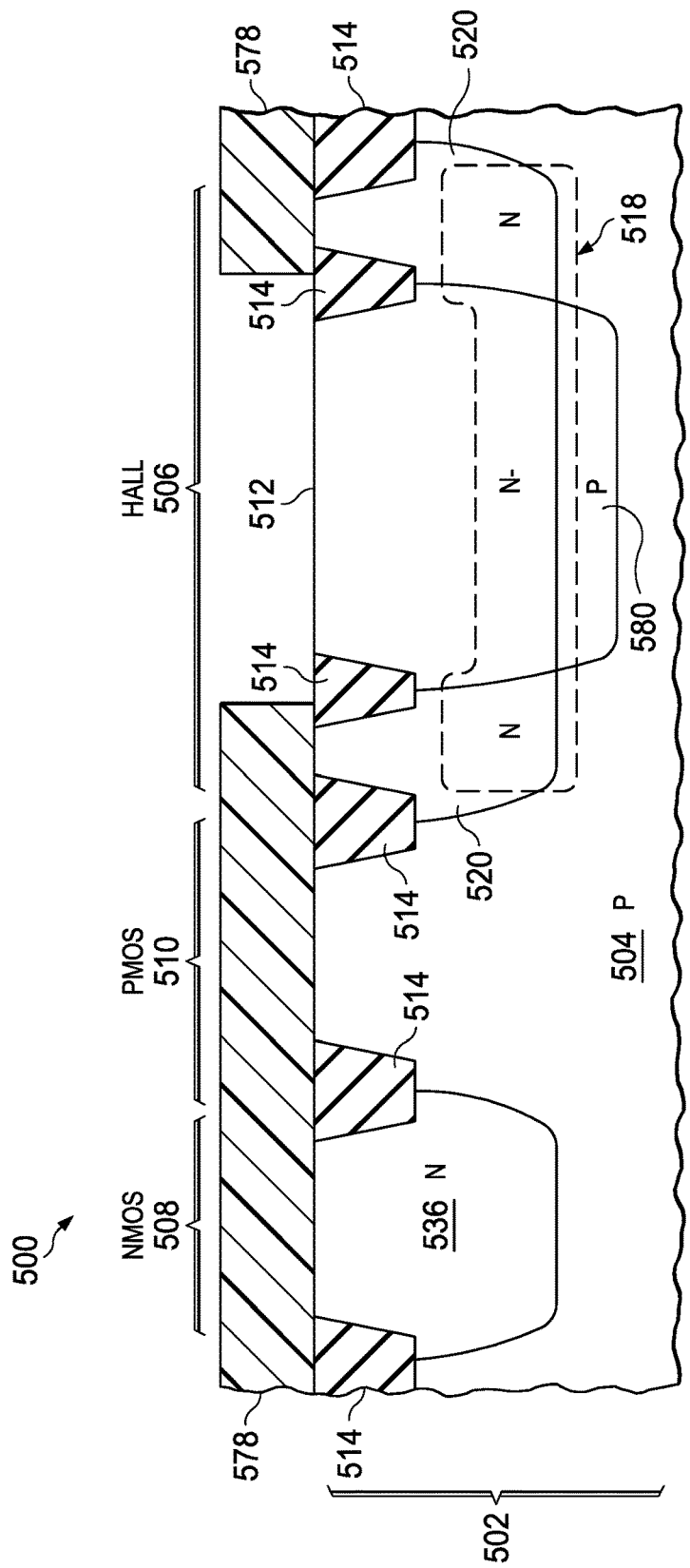
Figure 5C:
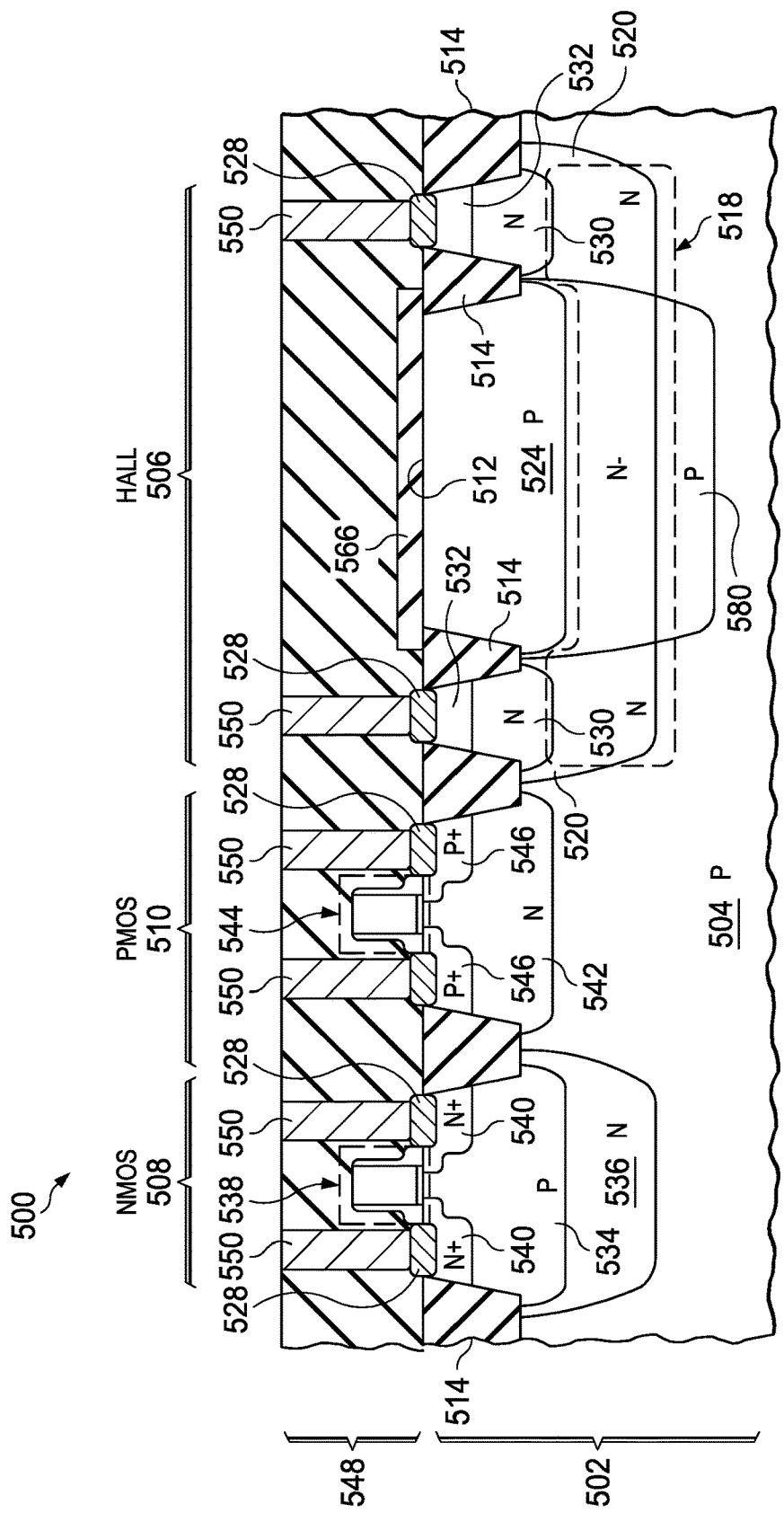

FIG. 5A through FIG. 5C are cross sections of another integrated circuit containing a Hall sensor, depicted steps of formation of isolation layers. Referring to FIG. 5A, the integrated circuit 500 is formed in and on a substrate 502 having a p-type semiconductor material 504. The integrated circuit includes an area for a Hall sensor 506, an NMOS transistor 508 and a PMOS transistor 510. The integrated circuit 500 may include field oxide 514 disposed at the top surface 512 of the substrate 502 to laterally isolate components and elements.

An isolation mask 556 is formed over the substrate 502 so as to expose an area for a first n-type isolation layer 520 in the area for the Hall sensor 506 and a second n-type isolation layer 536 under the area for the NMOS transistor 508. The isolation mask 556 may be formed similarly to the isolation mask 156 described in reference to FIG. 2A. In the instant example, the area for the Hall sensor 506 and the area for the NMOS transistor 508 are separate. The isolation mask 556 covers the area for the PMOS transistor 510. N-type dopants such as phosphorus are implanted into the substrate 502 where exposed by the isolation mask 556; the n-type dopants are blocked from the substrate 502 by the isolation mask 556. The n-type dopants may be implanted at a dose and an energy, for example, as described in reference to FIG. 2A. The isolation mask 556 is subsequently removed, for example by an ash process followed by a wet clean process. The implanted n-type dopants are activated by an anneal process to form the first n-type isolation layer 520 in the area for the Hall sensor 506 which provides a Hall plate 518 of the Hall sensor 506, and to form the second n-type isolation layer 536 under the area for the NMOS transistor 508. The anneal process may include a furnace anneal process or a rapid thermal anneal process. In an alternate version of the instant example, the anneal process may be performed until a subsequent compensation implant is completed. Concurrently forming the second n-type isolation layer 536 and the first n-type isolation layer 520 may advantageously reduce fabrication cost and complexity of the integrated circuit 500 compared to forming the n-type isolation layers separately.

Referring to FIG. 5B, a compensation mask 578 is formed over the substrate 502 so as to expose at least a drift region of the Hall plate 518 as depicted in FIG. 5B, and possibly the entire Hall plate 518. The compensation mask 578 covers the areas for the NMOS transistor 508 and the PMOS transistor 510. P-type dopants such as boron are implanted into the substrate 502 in the area exposed by the compensation mask 578; the p-type dopants are blocked from the substrate 502 by the compensation mask 578. The p-type dopants are implanted at a dose and energy to distribute the p-type dopants throughout the Hall plate 518 at a dopant density lower than the n-type dopants in the Hall plate 518. The p-type dopants may be implanted at a dose, for example, of 50 percent to 80 percent of the dose of the n-type dopants which were implanted to form the first n-type isolation layer 520. The compensation mask 578 is subsequently removed, for example by a similar process used to remove the isolation mask 556 of FIG. 5A. The implanted p-type dopants are activated by an anneal process to form a compensation well 580 which compensates the Hall plate 518. The implanted p-type dopants in the compensation well 580 are distributed so as to reduce a net average doping density of the Hall plate 518 while maintaining an n-type conductivity in the Hall plate 518. Reducing the net average doping density of the Hall plate 518 advantageously improves a sensitivity of the Hall sensor 506. Reducing the net average doping density of the Hall plate 518 by the compensation well 580 may advantageously provide a more uniform net doping density in a compensated portion of the Hall plate 518. In an alternate version of the instant example, the compensation well 580 may be formed prior to the first n-type isolation layer 520 and the second n-type isolation layer 536.

Referring to FIG. 5C, formation of the integrated circuit 500 continues with formation of a first shallow p-type well 524 and a second shallow p-type well 534 in the substrate 502. The first shallow p-type well 524 is formed over, and extending to, the Hall plate 518. The second shallow p-type well 534 is formed in the second n-type isolation layer 536 in the area for the NMOS transistor 508. The first shallow p-type well 524 and the second shallow p-type well 534 are formed concurrently, for example as described in reference to FIG. 2B, accruing the advantages disclosed therein. First shallow n-type wells 530 and a second shallow n-type well 542 are formed concurrently in the substrate 502, in the areas for the Hall sensor 506 and the PMOS transistor 510, respectively. The first shallow n-type wells 530 provide electrical connections to the Hall plate 518. The first shallow n-type wells 530 and the second shallow n-type well 542 may be formed as described in reference to FIG. 2C, for example, accruing the advantages disclosed therein.

An NMOS gate structure 538 of the NMOS transistor 508 and a PMOS gate structure 544 of the PMOS transistor 510 are formed on the substrate 502. N-type contact regions 532 and NSD regions 540 are formed concurrently in the areas for the Hall sensor 506 and the NMOS transistor 508, respectively. The n-type contact regions 532 and the NSD regions 540 may be formed as described in reference to FIG. 2D, for example, accruing the advantages disclosed therein. PSD regions 546 of the PMOS transistor 510 are formed as described in reference to FIG. 2E. In the instant example, a p-type region are not formed at a top surface 512 of the substrate 502 in the Hall sensor 506 concurrently with the PSD regions 546, as described in reference to other examples herein.

In the instant example, a layer of silicide block dielectric 566 is formed over the first shallow p-type well 524. Subsequently, metal silicide 528 is formed on exposed semiconductor material at the top surface 512 of the substrate 502, including on the NSD regions 540 of the NMOS transistor 508, the PSD regions 546 of the PMOS transistor 510 and the n-type contact regions 532 of the Hall sensor 506. The first shallow p-type well 524 is free of the metal silicide 528 due to the layer of silicide block dielectric 566.

A PMD layer 548 is formed over the field oxide 514, the metal silicide 528, the layer of silicide block dielectric 566 and the gate structures 538 and 544. The PMD layer 548 may have a similar structure to the PMD layer 148 and be formed by the processes discussed in reference to FIG. 1. Contacts 550 are formed through the PMD layer 548 to make electrical connections to the Hall sensor 506, the NMOS transistor 508 and the PMOS transistor 510 through the metal silicide 528. The contacts 550 may be formed by etching contact holes through the PMD layer 548, and forming a titanium liner, by sputtering or an ionized metal plasma (IMP) process, on the PMD layer 548 and extending into the contact holes. A titanium nitride liner is formed, by reactive sputtering or atomic layer deposition (ALD), on the titanium liner. A layer of tungsten is formed, by a metal organic chemical vapor deposition (MOCVD) process, on the titanium nitride liner, filling the contact holes. The tungsten, titanium nitride and titanium are removed from over a top surface of the PMD layer 548 by a tungsten CMP process, leaving the tungsten fill metal, titanium nitride liner and titanium liner in the contact holes to provide the contacts 550.

Figure 6:
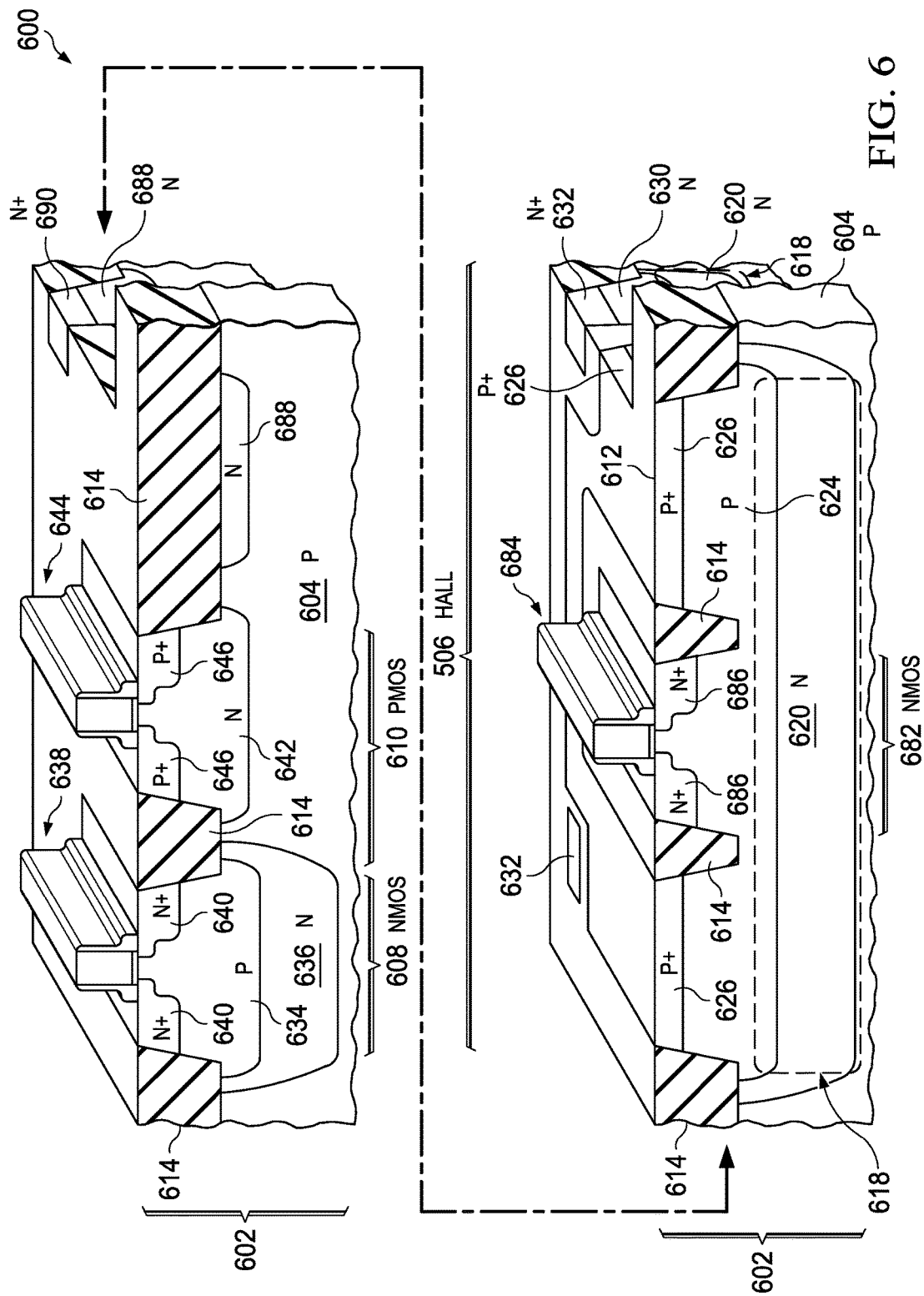
FIG. 6 is a cross section of another example integrated circuit containing a Hall sensor.

FIG. 6 is a cross section of another example integrated circuit containing a Hall sensor. The integrated circuit 600 has a substrate 602 including a p-type semiconductor material 604. The integrated circuit 600 includes a Hall sensor 606, a first NMOS transistor 608, a PMOS transistor 610 and a circuit component 682 disposed over a Hall plate 618 of the Hall sensor 606. In the instant example, the circuit component 682 is a second NMOS transistor 682. In the instant example, the Hall sensor 606 is a horizontal Hall sensor. A vertical Hall sensor is within the scope of the instant example. The integrated circuit 600 may include field oxide 614 disposed at the top surface 612 of the substrate 602 to laterally isolate components and elements.

The Hall sensor 606 includes the Hall plate 618 disposed in a first n-type isolation layer 620 in the substrate 602. An average net dopant density of the Hall plate 618 may be, for example, $5 \times 10^{16}$ cm$^{-3}$ to $1 \times 10^{17}$ cm$^{-3}$. A thickness of the Hall plate 618 may be 0.5 microns to 1 micron. The average net dopant density and the thickness may provide a sheet resistance of 850 ohms per square to 2500 ohms per square of the Hall plate 618. The Hall sensor 606 includes a first shallow p-type well 624 disposed in the substrate 602 over, and extending to, the Hall plate 618. In the instant example, p-type regions 626 may be disposed in the first shallow p-type well 624, at the top surface 612 of the substrate 602. The first shallow p-type well 624 may extend below the field oxide 614. Electrical connections to the Hall plate 618 may be provided by first shallow n-type wells 630 disposed in the substrate 602; only one first shallow n-type well 630 is visible in FIG. 6. The first shallow n-type wells 630 may be laterally separated from the first shallow p-type well 624 by elements of the field oxide 614. N-type contact regions 632 may be disposed in the substrate 602 over the first shallow n-type wells 630 to reduce electrical resistance to the Hall plate 618. Metal silicide, a PMD layer and metal interconnects are not shown in FIG. 6, but are present in the completed integrated circuit 600.

The first NMOS transistor 608 is disposed over a second shallow p-type well 634 disposed in the substrate 602. The first shallow p-type well 624 of the Hall sensor 606 and the second shallow p-type well 634 have substantially equal distributions of p-type dopants such as boron as a result of being formed concurrently, for example as described in reference to FIG. 2B. The second shallow p-type well 634 is contained in a second n-type isolation layer 636, which may be separate from the first n-type isolation layer 620 which provides the Hall plate 618 as depicted in FIG. 6. Alternatively, the second shallow p-type well 634 may be contained in a common n-type isolation layer which provides the Hall plate 618, as described in reference to FIG. 1. In either case, the second n-type isolation layer 636 containing the second shallow p-type well 634 and the first n-type isolation layer 620 which provides the Hall plate 618 have substantially equal distributions of n-type dopants such as phosphorus as a result of being formed concurrently, for example as described in reference to FIG. 2A. The first NMOS transistor 608 includes an NMOS gate structure 638 disposed over the second shallow p-type well 634 and NSD regions 640 disposed in the substrate 602 adjacent to, and partially underlapping, the NMOS gate structure 638, similar to that described in reference to FIG. 1. The n-type contact regions 632 of the Hall sensor 606 and the NSD regions 640 have substantially equal distributions of n-type dopants such as phosphorus and arsenic as a result of being formed concurrently, for example as described in reference to FIG. 2D.

The PMOS transistor 610 is disposed over a second shallow n-type well 642 disposed in the substrate 602. The first shallow n-type wells 630 of the Hall sensor 606 and the second shallow n-type well 642 have substantially equal distributions of n-type dopants such as phosphorus as a result of being formed concurrently, for example as described in reference to FIG. 2C. The PMOS transistor 610 includes a PMOS gate structure 644 and PSD regions 646 disposed in the substrate 602 adjacent to, and partially underlapping, the PMOS gate structure 644, similar to that described in reference to FIG. 1. The p-type regions 626 of the Hall sensor 606 and the PSD regions 646 have substantially equal distributions of p-type dopants such as boron as a result of being formed concurrently, for example as described in reference to FIG. 2E.

In the instant example, the second NMOS transistor 682 is disposed over the first shallow p-type well 624 disposed over the Hall plate 618. The second NMOS transistor 682 includes an NMOS gate structure 684 disposed over the first shallow p-type well 624 and NSD regions 686 disposed in the substrate 602 adjacent to, and partially underlapping, the NMOS gate structure 684, similar to that described in reference to FIG. 1. The second NMOS transistor 682 may be part of a current source which provides current to the Hall sensor 606 or part of a voltage sensor which senses a voltage produced by the Hall sensor 606. Forming the second NMOS transistor 682 may advantageously reduce a size and fabrication cost of the integrated circuit 600. Other components may be formed in over the first shallow p-type well 624, accruing a similar advantage.

An n-type well resistor 688 may be disposed in the substrate 602 under the field oxide 614. The n-type well resistor 688 may be part of a circuit which includes the second NMOS transistor 682. The n-type well resistor 688 may be advantageously formed concurrently with the first shallow n-type wells 630 of the Hall sensor 606. Connections to the n-type well resistor 688 may be provided by n-type contact regions 690, of which one instance is shown in FIG. 6, which may advantageously formed concurrently with the n-type contact regions 632 of the Hall sensor 606.

Figure 7:
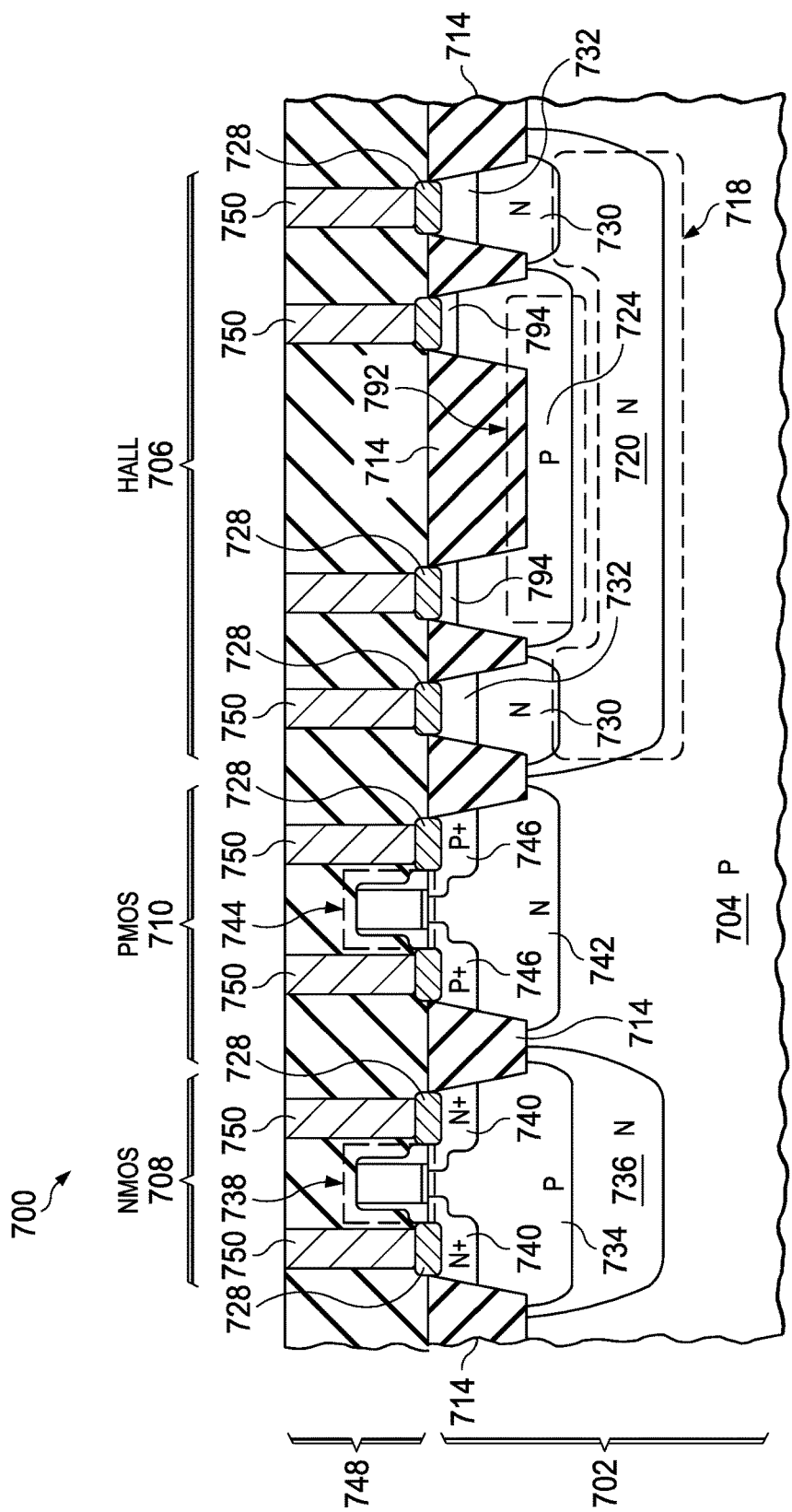
FIG. 7 is a cross section of another example integrated circuit containing a Hall sensor.

FIG. 7 is a cross section of another example integrated circuit containing a Hall sensor. The integrated circuit 700 has a substrate 702 including a p-type semiconductor material 704. The integrated circuit 700 includes a Hall sensor 706, a first NMOS transistor 708, a PMOS transistor 710 and a circuit component 792 disposed over an n-type Hall plate 718 of the Hall sensor 706. In the instant example, the circuit component 792 is a p-type Hall plate 792. In the instant example, the Hall sensor 706 is a horizontal Hall sensor. A vertical Hall sensor is within the scope of the instant example. The integrated circuit 700 may include field oxide 714 disposed at the top surface 712 of the substrate 702 to laterally isolate components and elements.

The Hall sensor 706 includes the n-type Hall plate 718 disposed in a first n-type isolation layer 720 in the substrate 702, as described in the examples herein. Electrical connections to the n-type Hall plate 718 may be provided by first shallow n-type wells 730 disposed in the substrate 702. N-type contact regions 732 may be disposed in the substrate 702 over the first shallow n-type wells 730 to reduce electrical resistance to the n-type Hall plate 718.

The Hall sensor 706 includes a first shallow p-type well 724 disposed in the substrate 702 over, and extending to, the n-type Hall plate 718. The first shallow n-type wells 730 may be laterally separated from the first shallow p-type well 724 by elements of the field oxide 714. In the instant example, field oxide 714 is disposed in the first shallow p-type well 724, at the top surface 712 of the substrate 702. The first shallow p-type well 724 extends below the field oxide 714. The first shallow p-type well 724 provides the p-type Hall plate 792 over the n-type Hall plate 718. Electrical connections to the p-type Hall plate 792 are provided through openings in the field oxide 714 within the first shallow p-type well 724. P-type contact regions 794 may be formed in the openings to reduce electrical resistance of the connections to the p-type Hall plate 792. The p-type Hall plate 792 may be part of the Hall sensor 706 to improve a sensitivity of the Hall sensor 706, or may be part of a second Hall sensor in the integrated circuit 700. Forming the p-type Hall plate 792 over the n-type Hall plate 718 may advantageously reduce size and fabrication cost of the integrated circuit 700.

The first NMOS transistor 708 is disposed over a second shallow p-type well 734 contained in a second n-type isolation layer 736, disposed in the substrate 702. The second shallow p-type well 734 and the second n-type isolation layer 736 are formed concurrently with the first shallow p-type well 724 and the first n-type isolation layer 720, respectively. The first NMOS transistor 708 includes an NMOS gate structure 738 and NSD regions 740 similar to those described in reference to FIG. 1. The PMOS transistor 710 is disposed over a second shallow n-type well 742 disposed in the substrate 702. The first shallow n-type wells 730 of the Hall sensor 706 and the second shallow n-type well 742 are formed concurrently. The PMOS transistor 710 includes a PMOS gate structure 744 and PSD regions 746 similar to those described in reference to FIG. 1.

Metal silicide 728 may be formed on exposed semiconductor material at the top surface 712 of the substrate 702, to reduce electrical resistance of connections to the n-type contact regions 732 for the n-type Hall plate 718, to the p-type contact regions 794 for the p-type Hall plate 792, to the NSD regions 740 and to the PSD regions 746. A PMD layer 748 and contacts 750, for example as described in reference to FIG. 1, are disposed over the top surface 712 of the substrate 702. Layers of metal interconnects and dielectric material, not shown in FIG. 7, are disposed above the PMD layer 748 to provide electrical connections between the components of the integrated circuit 700. The integrated circuit 700 accrues the advantages discussed in reference to the integrated circuit 100 of FIG. 1.

Figure 8:
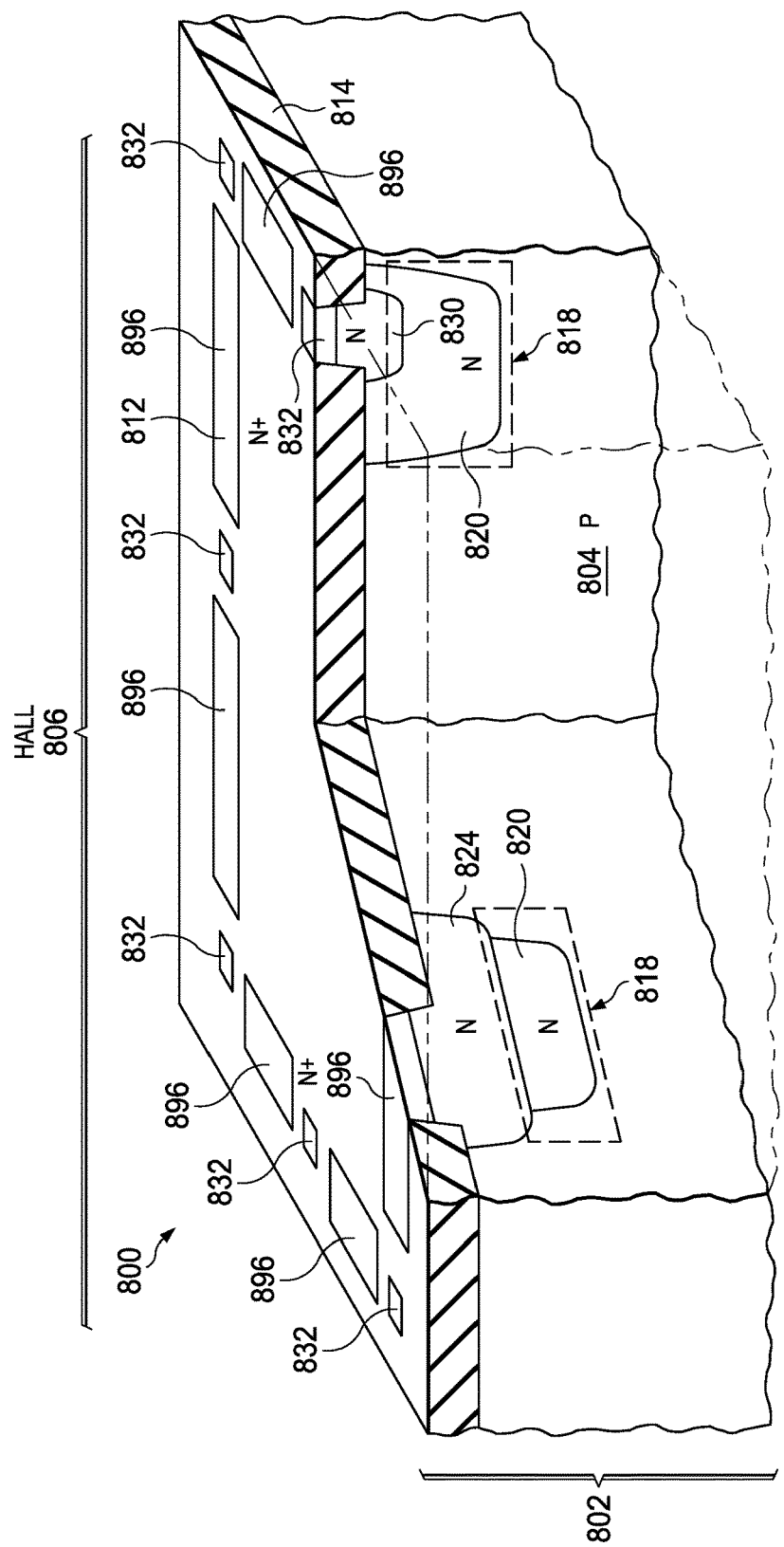
FIG. 8 is a cross section of another example integrated circuit containing a Hall sensor.

FIG. 8 is a cross section of another example integrated circuit containing a Hall sensor. The integrated circuit 800 has a substrate 802 including a p-type semiconductor material 804. The integrated circuit 800 includes a Hall sensor 806, and an NMOS transistor and a PMOS transistor, not shown in FIG. 8. In the instant example, the Hall sensor 806 is a vertical Hall sensor. A horizontal Hall sensor is within the scope of the instant example. The integrated circuit 800 may include field oxide 814 disposed at the top surface 812 of the substrate 802 to laterally isolate components and elements.

The Hall sensor 806 includes a Hall plate 818 with a non-linear configuration, in the instant example, a closed-loop configuration, disposed in an n-type isolation layer 820 in the substrate 802. Other configurations of the Hall plate 818 are within the scope of the instant example. Electrical connections to the Hall plate 818 may be provided by shallow n-type wells 830 disposed in the substrate 802, around the closed loop. A plurality of shallow p-type wells 824 are disposed in the substrate 802 over the Hall plate 818 around the closed loop between the shallow n-type wells 830. The shallow n-type wells 830 may be laterally separated from the shallow p-type wells 824 by elements of the field oxide 814. N-type contact regions 832 may be disposed in the substrate 802 over the shallow n-type wells 830 to reduce electrical resistance to the Hall plate 818. In the instant example, n-type regions 896 are formed in the substrate 802 over the shallow n-type wells 830, extending to the top surface 812. The advantages discussed in reference to other examples disclosed herein may be accrued by the integrated circuit 800. Forming the isolation layer 820 to provide the Hall plate 818 advantageously enables a Hall sensor 806 with a desired configuration. Metal silicide, a PMD layer and metal interconnects are not shown in FIG. 8, but are present in the completed integrated circuit 800.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An integrated circuit, comprising:
   a substrate having a surface;
   a first doped region extending from the surface to a first depth, the first doped region having a first conductivity type;
   a second doped region within the first doped region, and extending from the surface to a second depth less than the first depth, the second doped region having a second conductivity type opposite of the first conductivity type;
   a first transistor within the second doped region;
   a second transistor outside of the first doped region and the second doped region; and
   a Hall sensor having a Hall plate in the first doped region below the second depth and free of overlapping the second transistor.

2. The integrated circuit of claim 1, wherein the first transistor includes a metal oxide semiconductor (MOS) transistor having a body in the second doped region and isolated by the first doped region.

3. The integrated circuit of claim 1, wherein the Hall sensor includes:
   first and second silicide layers spaced apart from each other along the surface;
   a third doped region having the first conductivity type, and extending from the first silicide layer;
   a fourth doped region having the first conductivity type, extending from the second silicide layer and laterally isolated from the third doped region; and
   the Hall plate positioned under and connecting between the third doped region and the fourth doped region.

4. The integrated circuit of claim 3, wherein:
   each of the third doped region and the fourth doped region has a first dopant density; and
   the Hall plate has a second dopant density lower than the first dopant density.

5. The integrated circuit of claim 3, further comprising:
   a current source coupled between the first silicide layer and the second silicide layer.

6. The integrated circuit of claim 3, wherein the Hall sensor includes:
   a fifth doped region positioned above the Hall plate and laterally between the third doped region and the fourth doped region, the fifth doped region having the second conductivity type.

7. The integrated circuit of claim 3, wherein the Hall sensor includes:
   an isolation structure positioned above the Hall plate and laterally between the third doped region and the fourth doped region.

8. The integrated circuit of claim 3, wherein the Hall sensor includes:
   a voltage sensor;

a third silicide layer coupled to the voltage sensor, the third silicide layer spaced apart and positioned between the first silicide layer and the second silicide layer along the surface; and a fifth doped region extending from the third silicide layer and laterally isolated from the third doped region and the fourth doped region, the fifth doped region having the first conductivity type.

9. The integrated circuit of claim 1, wherein the Hall plate is free of overlapping the second doped region.

10. The integrated circuit of claim 1, wherein the Hall plate is directly under the second doped region.

* * * * *